US010667438B2

(12) United States Patent
Steinbrecher et al.

(10) Patent No.: US 10,667,438 B2
(45) Date of Patent: May 26, 2020

(54) MAINTENANCE PREDICTION OF ELECTRONIC DEVICES USING PERIODIC THERMAL EVALUATION

(71) Applicant: INTEL CORPORATION, Santa Clara, CA (US)

(72) Inventors: Robin A. Steinbrecher, Olympia, WA (US); Nishi Ahuja, University Place, WA (US); Sandeep Ahuja, University Place, WA (US)

(73) Assignee: Intel Corporation, Santa Clara, CA (US)

( * ) Notice: Subject to any disclaimer, the term of this patent is extended or adjusted under 35 U.S.C. 154(b) by 1082 days.

(21) Appl. No.: 13/728,174

(22) Filed: Dec. 27, 2012

(65) Prior Publication Data

US 2014/0188434 A1    Jul. 3, 2014

(51) Int. Cl.
*G06F 11/30* (2006.01)
*G21C 17/00* (2006.01)
(Continued)

(52) U.S. Cl.
CPC ..... *H05K 7/20836* (2013.01); *G05B 23/0283* (2013.01)

(58) Field of Classification Search
CPC . H05K 7/20836; G05B 23/0283; G05B 23/02
(Continued)

(56) References Cited

U.S. PATENT DOCUMENTS

| 6,528,957 B1 * | 3/2003 | Luchaco | H05B 37/034 307/31 |
| 7,489,092 B1 * | 2/2009 | Larky | F04D 27/004 318/34 |

(Continued)

FOREIGN PATENT DOCUMENTS

| CN | 1412632 A | 4/2003 |
| CN | 101601023 A | 12/2009 |

(Continued)

OTHER PUBLICATIONS

International Search Report and Written Opinion received for PCT Patent Application No. PCT/US2013/076549, dated Apr. 9, 2014, 13 pages.

(Continued)

*Primary Examiner* — Michael P Nghiem
(74) *Attorney, Agent, or Firm* — International IP Law Group, P.L.L.C.

(57) ABSTRACT

A method for determining whether to perform maintenance for an electronic device includes generating a baseline characterization of thermal performance for a heat-generating component of the electronic device at a baseline date. The method also includes generating an assessment characterization of the thermal performance at an assessment date after the baseline date. The method further includes generating a historical trend that includes the baseline characterization and the assessment characterization. Additionally, the method includes determining whether to perform maintenance for the heat-generating component based on the historical trend and a specified maintenance parameter.

30 Claims, 4 Drawing Sheets

(51) Int. Cl.
  *G01K 1/08* (2006.01)
  *H05K 7/20* (2006.01)
  *G05B 23/02* (2006.01)

(58) Field of Classification Search
  USPC .................................................. 702/132, 184
  See application file for complete search history.

(56) References Cited

U.S. PATENT DOCUMENTS

| | | | |
|---|---|---|---|
| 2003/0079483 A1 | 5/2003 | Komatsu et al. | |
| 2003/0125900 A1* | 7/2003 | Orenstien | G06F 1/3203 702/132 |
| 2006/0167591 A1* | 7/2006 | McNally | G06Q 50/06 700/291 |
| 2007/0039719 A1 | 2/2007 | Eriksen | |
| 2008/0245083 A1 | 10/2008 | Tutunoglu et al. | |
| 2009/0281761 A1* | 11/2009 | Bandholz | G06F 11/30 702/132 |
| 2010/0271199 A1* | 10/2010 | Belov | G01M 5/00 340/539.3 |
| 2011/0060568 A1 | 3/2011 | Goldfine et al. | |
| 2012/0053858 A1 | 3/2012 | Rollmann et al. | |
| 2012/0273159 A1 | 11/2012 | Eriksen | |
| 2013/0007440 A1* | 1/2013 | Shah | G06F 1/206 713/100 |
| 2014/0039648 A1* | 2/2014 | Boult | G05B 15/02 700/79 |

FOREIGN PATENT DOCUMENTS

| | | |
|---|---|---|
| CN | 102112826 A | 6/2011 |
| WO | 2014/105634 A1 | 7/2014 |

OTHER PUBLICATIONS

CN Office Action, CN Application No. 2013001728931, dated Jun. 13, 2017.

* cited by examiner

MAINTENANCE PREDICTION OF ELECTRONIC DEVICES USING PERIODIC THERMAL EVALUATION

TECHNICAL FIELD

The claimed subject matter relates generally to thermal systems. More specifically, the claimed subject matter relates to cooling systems for electronic devices.

BACKGROUND ART

Typically, servers and other computer devices use integral cooling systems to manage temperature sensitive components. One approach to cooling is forced convection. Forced convection cooling involves drawing air inside the device, directing the air to components for cooling. The components typically include heat sinks which help move heat away from the components and into the ambient air, which is exhausted out of the device.

However, the air drawn into the device contains fibers, dust particles, and other particulates. These particulates accumulate within the devices, causing a condition known as heat sink fouling, which progressively worsens the effectiveness of the cooling system. The current approach to address the dust accumulation is to perform regular maintenance to remove the dust. In some cases, air filters may help extend the length of the maintenance period. However, the air filters typically spread the dust over a larger surface area, and merely delay the inevitable maintenance. Use of air filters also causes increased flow impedance of a system resulting in system fans to run at higher speed and spend more energy in cooling the system.

BRIEF DESCRIPTION OF THE DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

In the following detailed description, numerous specific details are set forth in order to provide a thorough understanding. However, it will be apparent to one skilled in the art that embodiments may be practiced without these specific details. In other instances, well-known structures and devices are shown in block diagram form, rather than in detail, in order to avoid obscuring embodiments.

Reference in the specification to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Typically, datacenters schedule maintenance at regular intervals for all servers in a datacenter. Maintenance usually includes cleaning dust and particles from the heat sinks. Regular maintenance helps ensure that the servers stay within power thermal targets. The power thermal targets may be budgets for the amount of power dedicated to maintaining environmental temperature. However, this approach is expensive because many systems that are functioning within power thermal targets end up getting serviced.

Advantageously, when hundreds or thousands of servers are deployed in a datacenter and the datacenter operator, or owner, wants to minimize down-time, it is possible to delay maintenance as long as possible unless power consumption becomes a factor. At that time, cleaning the systems could result in much improved cooling and lower fan power.

Figure 1:
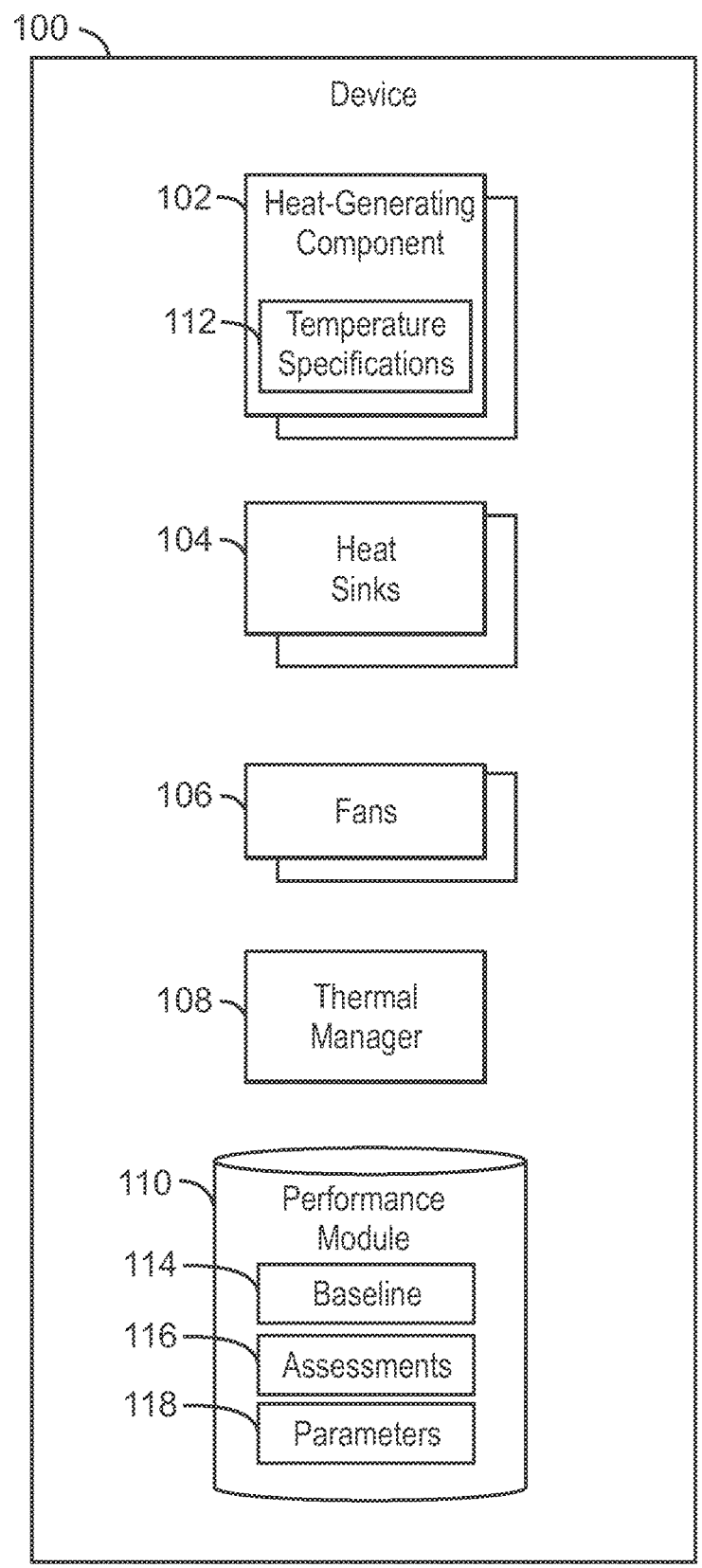
FIG. 1 is a block diagram of an electronic device in accordance with embodiments of the claimed subject matter.

FIG. 1 is a block diagram of an electronic device 100 in accordance with embodiments of the claimed subject matter. The device 100 may be a computing device, such as a server, desktop computer, laptop, tablet, smart phone, and so on. The device 100 includes heat-generating components 102, heat sinks 104, fans 106, a thermal manager 108, and a performance model 110. The heat-generating components 102 may be a processor, disk drive, high-power semiconductor device, power transistor, optoelectronic device, and so on. The heat-generating components 102 include a memory with temperature specifications 112. The temperature specifications 112 identify reliability, functional, and damage limits for the component 102. The reliability limit is a temperature limit to optimize cooling and acoustics. The functional limit is a temperature limit to optimize component performance and power management. The damage limit is a temperature limit that, when reached, results in the component 102 being shut down to avoid damage.

The heat sinks 104 are heat exchangers that cool an associated heat-generating component 102 by dissipating the component's heat into the surrounding air. In some cases, the heat sink 104 is connected with a fan 106, which increases the airflow through the heat sink 104. The fan 106 is operated by the thermal manager 108, which turns the fan on, off, and sets the fan speed based on current ambient temperature, and the component's operating temperature. It is noted that mobile devices such as phones and tablets use natural-convection cooling, and thus do not include fans 106.

Inside the device 100, various surfaces with narrow air channels or other constrictions can cause heat sink fouling. Heat sink fouling involves fibers from the air collecting on a surface of the heat sink 104. The fibers accumulate to form a mat that traps finer particulates. The more the heat sink 104 becomes blocked, the better the mat becomes at trapping smaller particulates. As a consequence of the fouling, thermal performance for the heat sink 104 deteriorates. Thermal performance represents the ability of the heat sink 104 to transfer heat away from the associated component 102.

Initially, the heat sink fouling leads to an increase in fan speed as the thermal manager 108 adjusts speed to maintain the component temperatures within their specified limits. Greater fan speed leads to higher power consumption. Typically, power consumption increases with the mathematical cube of fan speed. The fouling leads to increased flow impedance of the thermal system. This results in reduced airflow and higher component temperatures. Fan speed control algorithms increase fan speed to maintain specified component temperatures. In this way, increased fan speed maintains adequate airflow, even in a state of heat sink fouling.

If fans operate at their maximum speed to maintain component temperature, any additional fouling leads to performance degradation of the components 102 as a result of throttling. Throttling involves decreasing the rate of processing, e.g., CPU processing, to limit the heat generated by the component 102. Further degradation of the thermal system can lead to the component 102 shutting down to prevent overheating.

In one embodiment, the thermal manager 108 generates a performance model 110 of the thermal system. The performance model 110 includes a baseline 114, and periodic assessments 116 of the thermal system. The baseline 114 and assessments 116 are characterizations of the thermal system at a baseline period, when a new device 100 is first installed and powered up, and at scheduled intervals, respectively.

Thermal systems are typically designed with no margin, using a high stress workload condition for the environment to be supported. Accordingly, the baseline 114 and assessments 116 may be generated by running a constant power benchmark. This benchmark provides steady state thermal performance information including, but not limited to, component power consumption, air temperature at component inlet, air temperature at component exhaust, component temperature, and fan speeds.

The performance model 110 also includes maintenance parameters 118. The maintenance parameters 118 specify conditions for scheduling maintenance. The parameters 118 may specify thresholds for power consumption, fan speed, thermal performance, and the like, beyond which maintenance is to be scheduled. These parameters may specify, for example, that maintenance be scheduled if the constant power benchmark shows a 50% power increase in the current assessment 116 over the baseline 114. In one embodiment, the thermal manager 108 and performance model 110 are implemented in firmware of the device 100.

The thermal manager 108 compares a current assessment 116 to the baseline 114 of the thermal system. If the comparison shows the performance model 110 falls outside the maintenance parameters 118, maintenance is scheduled for the device 100. Maintenance may include removing dust from inside the device 100, around the component 102 and heat sink 104, and replacing materials of the thermal system.

In one embodiment, the thermal manager 108 estimates the average power increase between the dates of the current assessment 116 and the baseline 114. Additionally, the thermal manager 108 may recommend a maintenance date. The recommended maintenance date is before the component 102 is operating outside the maintenance parameters 118, and may be based on the average power increase, or on projected time to exceeding a component's thermal specification. During every assessment, the value of parameters such as inlet temperature, component temperature, fan speed, component power, system power, and so on, are stored to create a historical trend. The historical trend is used to project the amount of time that will pass before the component's thermal specification is expected to be exceeded. If this projected time is to end before the next scheduled assessment, an alert is issued to perform maintenance.

Figure 2:
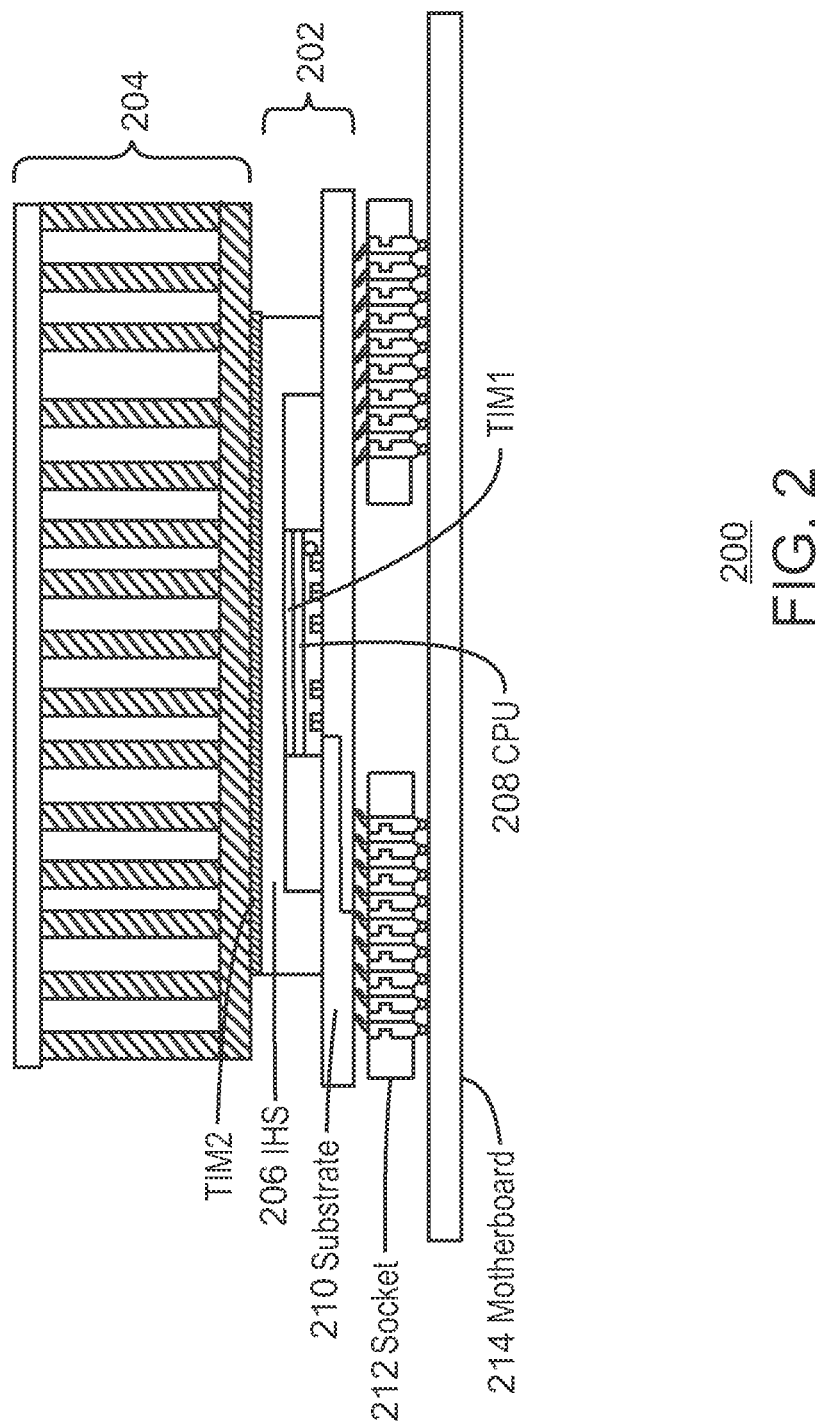
FIG. 2 is a block diagram of a central processing unit (CPU) thermal stack in accordance with embodiments of the claimed subject matter.

FIG. 2 is a block diagram of a central processing unit (CPU) thermal stack 200 in accordance with an embodiment of the claimed subject matter. The CPU thermal stack 200 includes a CPU package 202 and a heat sink 204, separated by thermal interface materials 1 and 2, (TIM1 and TIM2), and an integrated heat spreader (IHS) 206. The CPU package 202 includes the IHS 206, a CPU 208 on a substrate 210, plugged into a socket 212 on a motherboard 214. The TIM1 is a thermal interface material between the CPU and the IHS 206. The TIM2 is a thermal interface material between the CPU package 202 and the heat sink 204.

Over time, the TIM1 and TIM2 may degrade, thereby degrading the effectiveness of the thermal system. In such a case, removing dust from the component 102 does not provide as much improvement in thermal performance as expected. In one embodiment, after dust is removed from the component 102, the thermal manager 108 generates an assessment 116 to determine whether the thermal system is in accord with the thermal specifications 114. If not, the thermal manager 108 schedules maintenance to replace TIM2, and potentially the component itself if TIM1 has degraded beyond specified parameters 118.

Figure 3:
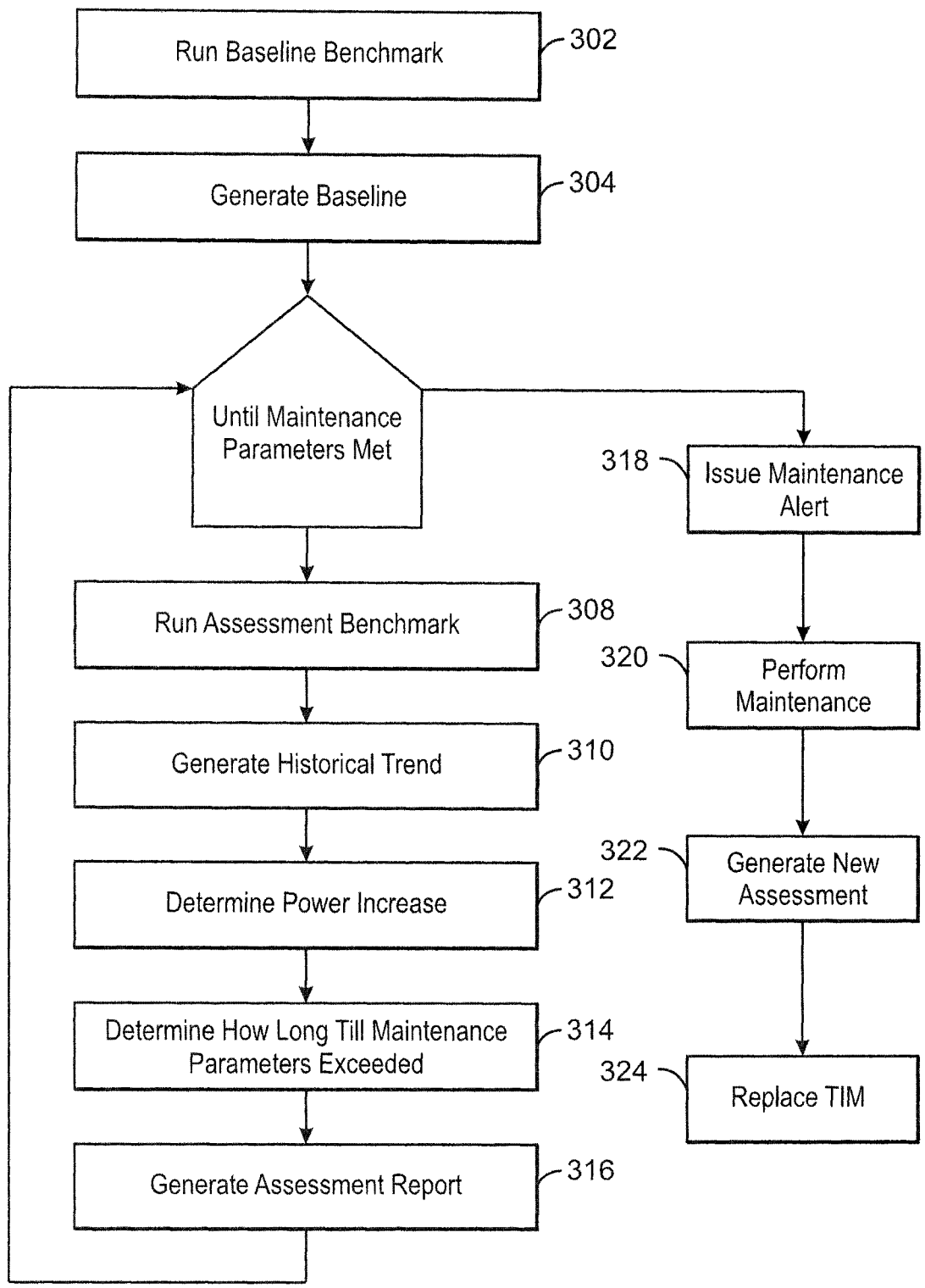
FIG. 3 is a process flow diagram for a method to schedule thermal system maintenance, in accordance with embodiments.

FIG. 3 is a process flow diagram for a method 300 to schedule thermal system maintenance, in accordance with embodiments. The method begins at block 302, where the baseline benchmark is run for a specific component 102. At block 304, the baseline 114 is generated based on the benchmark.

Block 306-316 are repeated at regularly scheduled assessment intervals until the performance model 110 exceeds the maintenance parameters 118. At block 308, an assessment benchmark is performed. The assessment benchmark is used to generate the assessment 116. The value of parameters such as the inlet temperature, component temperature, fan speed, and so on, are stored to create the historical trend.

At block 310, the thermal manager 108 generates a historical trend shown by the baseline 114 and the assessments 116. The thermal manager 108 maintains a history of assessment parameter values as a function of assessment dates. Historical data such this is used to evaluate how various parameters are trending, and used in projecting date at which performing maintenance may keep the heat-generating component 102 operating within maintenance parameters 118.

Based on the historical trend, at block 312, the thermal manager determines the average power increase between the dates of the baseline 114 and each successive assessment 116. At block 314, the thermal manager 108 estimates how long until the thermal system is operating outside of the maintenance parameters 118. The historical trend shown by the baseline 114 and the assessments 116 is used to determine the amount of time that passes before the component's thermal specification is expected to be exceeded. If this time is after the next scheduled assessment, at block 316, a report may be generated that includes, but is not limited to, the average power increase, estimated maintenance date, and projected fan speed increase. If the projected time is before the next scheduled assessment, the method 300 flows to block 318, where an alert is issued to perform maintenance on the device housing the component.

At block 320, the maintenance may be performed. For example, the heat sink 104 may be cleaned.

At block 322, a new benchmark may be run to generate a new assessment 116. At block 324, the thermal manager determines whether TIM2 is to be replaced. If TIM2 is replaced, a new assessment 116 may be generated to determine whether to replace the component 102 itself due to TIM1 degradation. TIM1 is not replaceable.

The process shown in FIG. 3 may be implemented in any suitable hardware, including logic circuits, one or more processors configured to execute computer-readable instructions, and the like.

Figure 4:
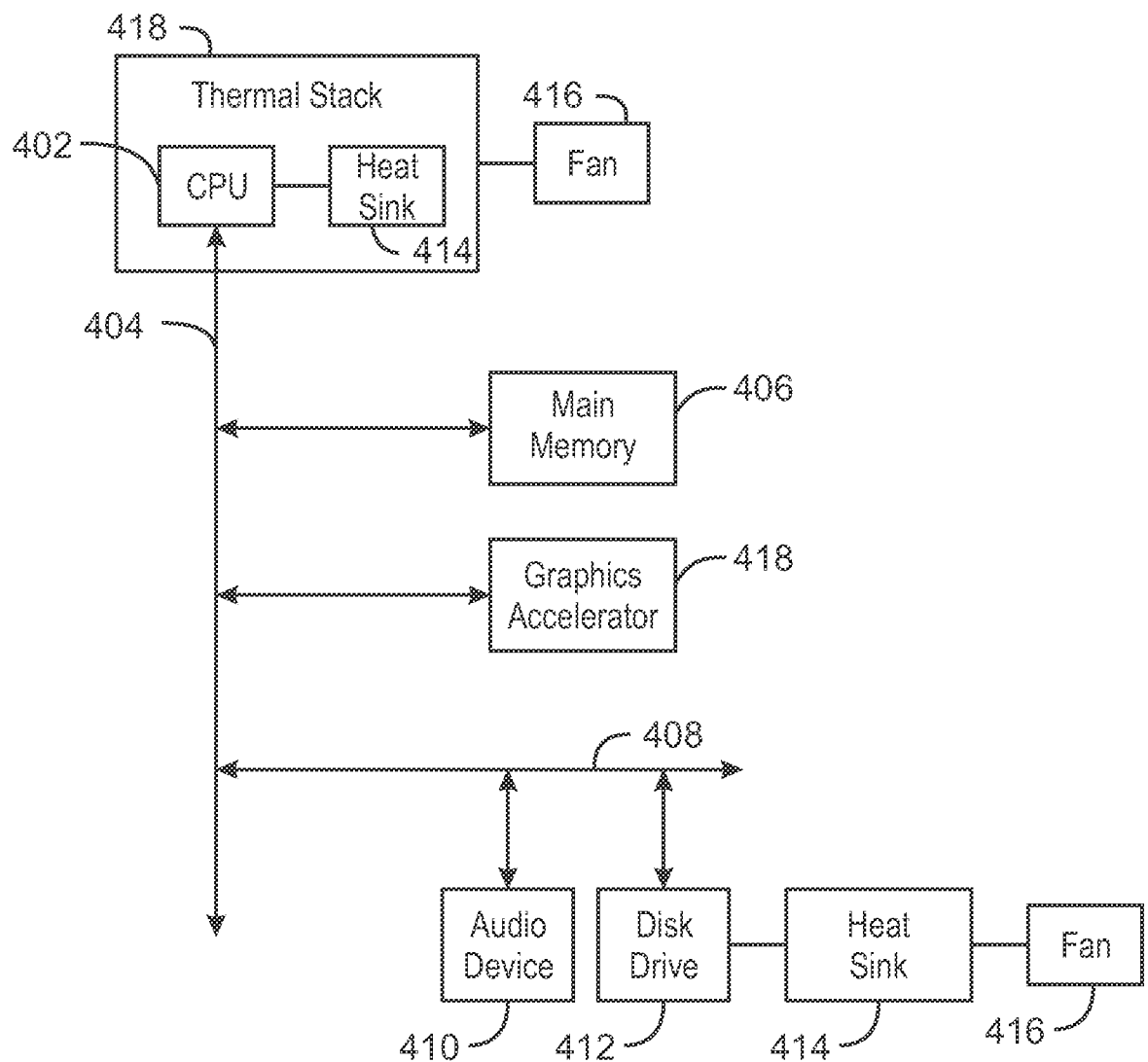
FIG. 4 is a block diagram of an example computer system, in accordance with embodiments of the claimed subject matter.

FIG. 4 is a block diagram of an example computer system 400, in accordance with embodiments. The computer system may include, but not be limited to, a server, desktop computer, notebook, tablet, smartphone, and the like. Although not shown, the computer system 400 may receive electrical power from a direct current (DC) source (e.g., a battery) or from an alternating current (AC) source (e.g., by connecting to an electrical outlet). The computer system 400 includes a central processing unit (CPU) or processor 402 coupled to a bus 404 that provides connectivity to other components of the system 400.

The processor 402 may include a memory controller (not shown) that is connected to a main memory 406. The main memory 406 may store data and sequences of instructions that are executed by the processor 402, or any other component included in the system 400. In one embodiment, the main memory 406 includes computer-readable media such as, volatile memory and nonvolatile memory. The nonvolatile memory may include read-only memory (ROM), programmable ROM (PROM), electrically-programmable ROM (EPROM), electrically-erasable programmable ROM (EEPROM), flash memory, and so on.

Volatile memory may include random access memory (RAM), such as static RAM (SRAM), dynamic RAM (DRAM), synchronous DRAM (SDRAM), double data rate SDRAM (DDR SDRAM), enhanced SDRAM (ESDRAM), DRAM (SLDRAM), direct RAM (RDRAM), direct dynamic RAM (DRDRAM), dynamic RAM (RDRAM).

The bus 404 may be connected to a Peripheral Component Interconnect (PCI) bus 408. The PCI bus 408 may provide a data path between the processor 402 and peripheral devices such as, audio device 410 and disk drive 412. Although not shown, other devices may also be connected to the PCI bus 408.

The processor 402 and disk drive 412 are examples of heat-generating devices, each of which is associated with a heat sink 414, and fan 416. A CPU thermal stack 418 includes the processor 402 and heat sink 414.

It is to be understood that specifics in the aforementioned examples may be used anywhere in one or more embodiments. For instance, features of the computing device described above may alternatively be implemented with respect to either of the methods or the computer-readable medium described herein. Furthermore, although the Figures herein describe embodiments, embodiments of the claimed subject matter are not limited to those diagrams or corresponding descriptions. For example, flow need not move through each illustrated box of FIG. 4 in the same specific order as illustrated herein.

Embodiments are not restricted to the particular details listed herein. Indeed, those skilled in the art having the benefit of this disclosure will appreciate that many other variations from the foregoing description and drawings may be made. Accordingly, it is the following claims, including any amendments thereto, that define the scope.

What is claimed is:

1. A method for determining whether to perform maintenance for an electronic computing device comprising a memory and a computer processor, the method comprising:
   generating a baseline characterization of thermal performance by a thermal system for a heat-generating component of the electronic computing device at a baseline date based on a constant power benchmark of the heat-generating component;
   generating an assessment characterization of the thermal performance by the thermal system based on an additional constant power benchmark of the heat-generating component that is performed at an assessment date after the baseline date;
   generating a historical trend by the thermal system for the heat-generating component, comprising the baseline characterization and the assessment characterization;
   estimating a maintenance date to perform thermal maintenance on the electronic computing device based on the historical trend and a specified maintenance parameter; and
   performing the thermal maintenance on the maintenance date.

2. The method of claim 1, wherein generating the historical trend comprises:
   determining assessment parameter values as a function of assessment dates for a plurality of assessments comprising the assessment characterization; and
   determining a trend for each of the assessment parameter values.

3. The method of claim 1, wherein generating the baseline characterization comprises:
   running the constant power benchmark; and
   determining an inlet temperature of the heat-generating component during the constant power benchmark;
   determining an operating temperature of the heat-generating component based on the inlet temperature; and
   determining a power consumption of the heat-generating component based on the operating temperature.

4. The method of claim 3, wherein generating the baseline characterization comprises determining fan speed.

5. The method of claim 1, comprising:
   determining an amount of time that passes before a thermal specification is expected to be exceeded based on the historical trend; and
   issuing a maintenance alert based on a determination that the amount of time ends before a next scheduled assessment of the heat-generating component.

6. The method of claim 5, comprising:
   presenting a report comprising:
      an average increase of power consumption by the heat-generating component; and
      the amount of time.

7. The method of claim 1, comprising:
   performing an additional assessment characterization after performing thermal maintenance comprising removing dust from the heat-generating component; and
   determining that a thermal interface material of the heat-generating component is to be replaced.

8. The method of claim 7, wherein the heat-generating component comprises a second thermal interface material.

9. A system, comprising:
   a processor; and
   a memory comprising computer-executable instructions configured to cause the processor to:
   generate a baseline characterization of thermal performance by a thermal system for a heat-generating component of an electronic computing device at a baseline date based on a constant power benchmark of the heat-generating component;
   generate an assessment characterization of the thermal performance by the thermal system based on an additional constant power benchmark of the heat-generating component that is performed at an assessment date after the baseline date;

generate a historical trend for the heat-generating component comprising the baseline characterization and the assessment characterization;

estimating a maintenance date to perform thermal maintenance on the electronic computing device based on the historical trend and a specified maintenance parameter; and replacing a thermal interface material on the maintenance date.

10. The system of claim 9, wherein generating the baseline characterization comprises running the constant power benchmark, comprising:

determining an inlet temperature of the heat-generating component during the constant power benchmark;

determining an operating temperature of the heat-generating component based on the inlet temperature; and determining a power consumption of the heat-generating component based on the operating temperature.

11. The system of claim 10, wherein generating the baseline characterization comprises determining fan speed.

12. The system of claim 9, comprising code configured to cause the processor to determine an average increase in power consumption between the baseline date and the assessment date.

13. The system of claim 12, comprising code configured to cause the processor to determine a period of time from a current time until the specified maintenance parameter is met.

14. The system of claim 13, comprising code configured to cause the processor to present a report comprising:
the average increase; and
the period of time.

15. The system of claim 9, comprising code configured to cause the processor to:

perform an additional assessment characterization after removing dust from the heat-generating component; and determine that the thermal interface material of the heat-generating component is to be replaced.

16. The system of claim 15, wherein the heat-generating component comprises a second thermal interface material.

17. A non-transitory computer-readable medium, comprising code configured to cause a computer processor to:

generate a baseline characterization of thermal performance by a thermal system for a heat-generating component of an electronic computing device at a baseline date based on a constant power benchmark of the heat-generating component;

generate an assessment characterization of the thermal performance by the thermal system based on an additional constant power benchmark of the heat-generating component at an assessment date after the baseline date;

generate a historical trend for the heat-generating component, comprising the baseline characterization and the assessment characterization;

determine a time when the heat-generating component is performing outside a specified maintenance parameter based on the historical trend; and operating the heat-generating component within the specified maintenance parameter in response to thermal maintenance performed on or before the time when the heat-generating component is performing outside the specified maintenance parameter.

18. The non-transitory computer-readable medium of claim 17, wherein generating the assessment characterization comprises running the additional constant power benchmark, comprising:

determining an inlet temperature of the heat-generating component during the constant power benchmark;

determining an operating temperature of the heat-generating component based on the inlet temperature; and determining a power consumption of the heat-generating component based on the operating temperature.

19. The non-transitory computer-readable medium of claim 17, wherein generating the baseline characterization comprises determining fan speed.

20. The non-transitory computer-readable medium of claim 17, comprising code configured to cause the computer processor to determine an average increase in power consumption between the baseline date and the assessment date.

21. The non-transitory computer-readable medium of claim 20, comprising code configured to issue a maintenance alert if a time is before a next scheduled assessment of the heat-generating component.

22. The non-transitory computer-readable medium of claim 21, comprising code configured to cause the computer processor to present a report comprising:
the average increase; and
a period of time from a current time until the time.

23. An electronic device, comprising:
logic to generate a baseline characterization of thermal performance for a thermal system of the electronic device at a baseline date based on a constant power benchmark of the thermal system;

logic to generate an assessment characterization of the thermal performance based on an additional constant power benchmark of a heat-generating component that is performed at an assessment date after the baseline date;

logic to generate a historical trend for the thermal system, comprising the baseline characterization and the assessment characterization; and logic to estimate a maintenance date to perform thermal maintenance on the electronic device based on the historical trend and a specified maintenance parameter; and logic to operate the heat-generating component within the specified maintenance parameter in response to the thermal maintenance performed on the maintenance date, wherein the logic is at least partially hardware logic.

24. The electronic device of claim 23, wherein the logic to generate the historical trend comprises:

logic to determine assessment parameter values as a function of assessment dates for a plurality of assessments comprising the assessment characterization; and logic to determine a trend for each of the assessment parameter values.

25. The electronic device of claim 23, wherein the logic to generate the baseline characterization comprises running the constant power benchmark, comprising:

logic to determine an inlet temperature of the heat-generating component during the constant power benchmark;

logic to determine an operating temperature of the heat-generating component based on the inlet temperature; and logic to determine a power consumption of the heat-generating component based on the operating temperature.

26. The electronic device of claim 25, wherein the logic to generate the baseline characterization comprises logic to determine fan speed.

27. The electronic device of claim 23, comprising logic to issue a maintenance alert if a time is before a next scheduled assessment of the heat-generating component associated with the thermal system.

28. The electronic device of claim 27, comprising:
   logic to determine a period of time from a current time until the specified maintenance parameter is exceeded; and
   logic to present a report comprising an average increase of power consumption by the heat-generating component over the period of time.

29. The electronic device of claim 23, comprising:
   logic to perform an additional assessment characterization after performing the thermal maintenance comprising removing dust from the heat-generating component; and
   logic to determine that a thermal interface material that removes heat from the heat-generating component is to be replaced.

30. The electronic device of claim 29, wherein the heat-generating component comprises a second thermal interface material.

* * * * *